US012777675B2

(12) United States Patent
Liu et al.

(10) Patent No.: US 12,777,675 B2
(45) Date of Patent: Oct. 27, 2026

(54) SEMICONDUCTOR STRUCTURE AND MANUFACTURING METHOD THEREOF

(71) Applicant: Hon Young Semiconductor Corporation, Hsinchu City (TW)

(72) Inventors: Liang-Ming Liu, Hsinchu City (TW); Yan-Ru Chen, Hsinchu City (TW)

(73) Assignee: Hon Young Semiconductor Corporation, Hsinchu City (TW)

( * ) Notice: Subject to any disclaimer, the term of this patent is extended or adjusted under 35 U.S.C. 154(b) by 351 days.

(21) Appl. No.: 18/430,612

(22) Filed: Feb. 1, 2024

(65) Prior Publication Data

US 2025/0120118 A1 Apr. 10, 2025

(30) Foreign Application Priority Data

Oct. 4, 2023 (TW) ................................ 112138176

(51) Int. Cl.

*H01L 29/78* (2006.01)
*H10D 30/01* (2025.01)
*H10D 30/66* (2025.01)
*H10D 64/27* (2025.01)
*H10D 62/832* (2025.01)

(52) U.S. Cl.

CPC ....... *H10D 30/668* (2025.01); *H10D 30/0297* (2025.01); *H10D 64/513* (2025.01); *H10D 62/8325* (2025.01)

(58) Field of Classification Search

CPC ............. H10D 30/668; H10D 30/0297; H10D 64/513; H10D 62/8325; H10D 64/518; H10P 76/405; H10P 76/408

See application file for complete search history.

(56) References Cited

U.S. PATENT DOCUMENTS

| | | | | |
|---|---|---|---|---|
| 7,615,849 B2 | 11/2009 | Nakamura et al. | | |
| 8,592,265 B2 | 11/2013 | Kim et al. | | |
| 9,293,549 B2 | 3/2016 | Masuda et al. | | |
| 10,784,350 B2 | 9/2020 | Hayashida et al. | | |
| 2013/0126904 A1* | 5/2013 | Masuda | H10D 12/031 | 257/77 |
| 2014/0162439 A1 | 6/2014 | Masuda et al. | | |
| 2016/0099325 A1* | 4/2016 | Calafut | H10D 30/025 | 257/331 |

FOREIGN PATENT DOCUMENTS

| | | |
|---|---|---|
| TW | I491044 B | 7/2015 |
| TW | I658595 B | 5/2019 |

* cited by examiner

*Primary Examiner* — Mohammed R Alam

(74) *Attorney, Agent, or Firm* — CKC & Partners Co., LLC

(57) ABSTRACT

A semiconductor structure includes a substrate, a gate structure, a first oxide layer, and a second oxide layer. The substrate has a trench. An inclined surface and a bottom surface of the trench have an obtuse angle therebetween. The gate structure is located in the trench. A width of a bottom surface of the gate structure is less than a width of a top surface of the gate structure. A cross-sectional profile of the gate structure is inverted trapezoid. The first oxide layer is located between the gate structure and the substrate. The second oxide layer is located on the top surface of the gate structure.

10 Claims, 11 Drawing Sheets

SEMICONDUCTOR STRUCTURE AND MANUFACTURING METHOD THEREOF

RELATED APPLICATIONS

This application claims priority to Taiwan Application Serial Number 112138176, filed, Oct. 4, 2023, which is herein incorporated by reference.

BACKGROUND

Field of Disclosure

The present disclosure relates to a semiconductor structure and a manufacturing method thereof.

Description of Related Art

In various power metal-oxide-semiconductor field-effect transistors (power MOSFETs), since the trench MOS structure can realize vertical channels to avoid forming equivalent junction field-effect transistors (JFETs), on-state resistance is reduced, and thus the trench MOSFET is one of the focuses of research and development.

However, when the gate-source voltage is applied to the conventional trench MOSFET, because a bottom angle of the gate is a right angle to concentrate the electric field, it is easy to cause gate oxide breakdown and generate leakage current, which fails components.

SUMMARY

According to some embodiments of the present disclosure, the semiconductor structure includes a substrate, a gate structure, a first oxide layer, and a second oxide layer. The substrate has a trench. An inclined surface and a bottom surface of the trench have an obtuse angle therebetween. The gate structure is located in the trench. A width of a bottom surface of the gate structure is less than a width of a top surface of the gate structure. A cross-sectional profile of the gate structure is inverted trapezoid. The first oxide layer is located between the gate structure and the substrate. The second oxide layer is located on the top surface of the gate structure.

According to some embodiments of the present disclosure, the manufacturing method of a semiconductor structure includes: forming a hard mask structure on a substrate, in which the hard mask structure has a recess, and a side wall of the hard mask structure facing the recess is stepped; etching the substrate from the recess through the hard mask structure to form a trench, in which the trench has a side wall and a bottom surface, and the side wall is stepped; planarizing the side wall of the trench to oxidize the side wall and the bottom surface, such that the side wall and the bottom surface have an obtuse angle therebetween; forming a first oxide layer on the side wall and the bottom surface of the trench; forming a gate structure on the first oxide layer in the trench, in which a width of a bottom surface of the gate structure is less than a width of a top surface of the gate structure, and a cross-sectional profile of the gate structure is inverted trapezoid; and forming a second oxide layer on the gate structure.

According to some embodiments of the present disclosure, the manufacturing method of a semiconductor structure includes: forming a photoresist layer on a film stack structure by using a photomask, in which the film stack structure has a plurality of first hard mask layers and a plurality of second hard mask layers sequentially stacked in a staggered manner; removing a first part of the topmost one of the plurality of second hard mask layers and a first part of one of the plurality of first hard mask layers thereunder; removing the photoresist layer; moving the photomask in a horizontal direction, and forming the photoresist layer again on the film stack structure; removing a second part of the topmost one of the plurality of second hard mask layers, and synchronously removing a first part of the other one of the plurality of second hard mask layers; removing the photoresist layer again, such that the film stack structure defines a stepped hard mask structure; etching a substrate located below the hard mask structure, such that the substrate has a trench and a stepped side wall facing the trench; oxidizing the stepped side wall to form a surface oxide layer; removing the surface oxide layer, such that the stepped side wall forms an inclined surface; and forming a gate structure in the trench of the substrate, such that a side wall and a bottom surface of the gate structure have an obtuse angle therebetween.

In the embodiments of the present disclosure, since the semiconductor structure has a gate structure with a trapezoidal cross-sectional profile, and the width of the bottom surface of the gate structure is less than the width of the top surface of the gate structure, the electric field concentrated in a base angle of the gate structure when a gate voltage is applied to the semiconductor structure can be reduced, avoiding gate oxide breakdown and the leakage current caused thereby. The semiconductor structure can be applied to trench metal-oxide-semiconductor field-effect transistors (trench MOSFETs) to improve the stability.

DETAILED DESCRIPTION

Figure 1:
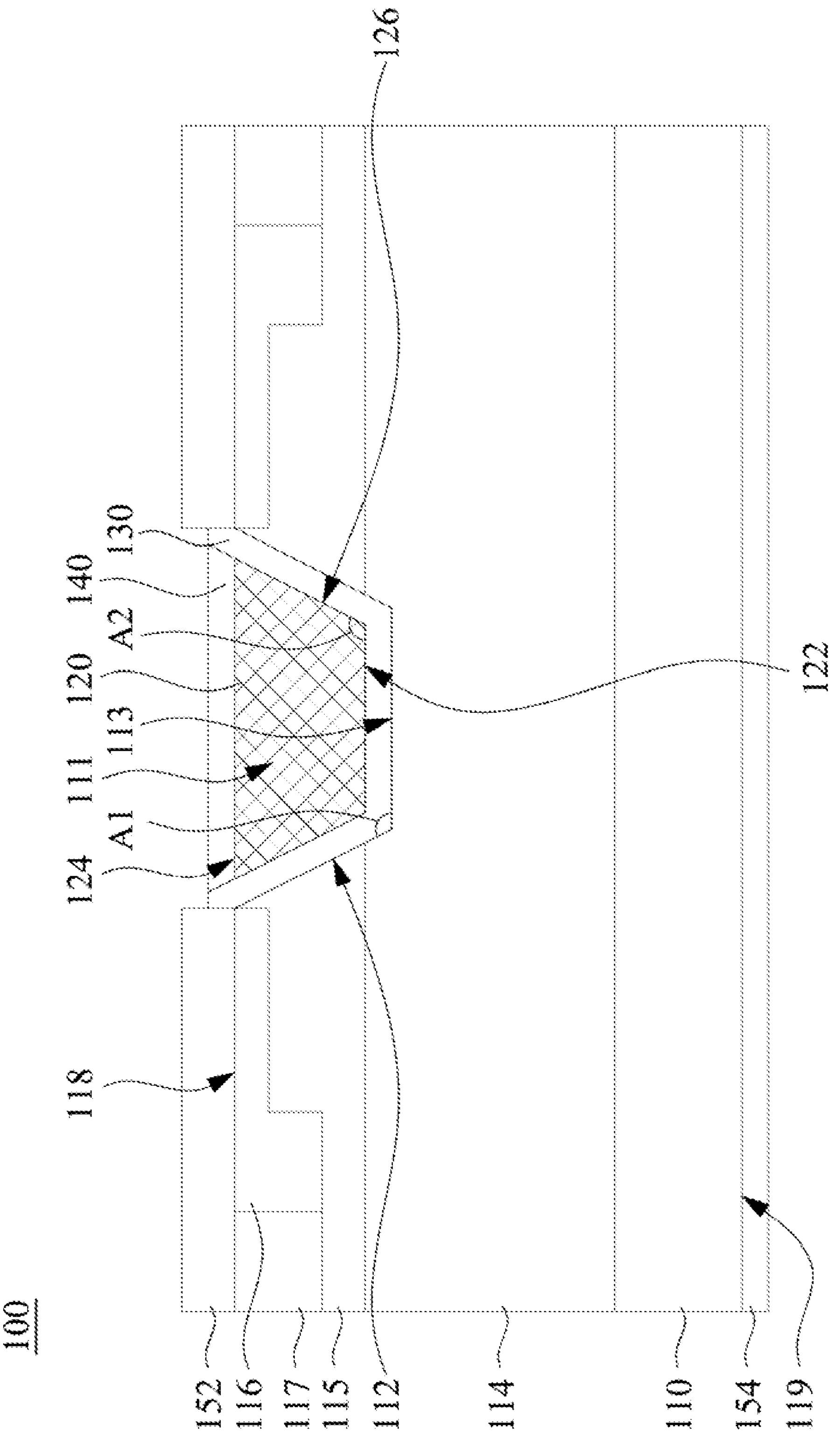
FIG. 1 illustrates a cross-sectional view of a semiconductor structure according to an embodiment of the present disclosure.

Further, spatially relative terms, such as “beneath,” “below,” “lower,” “above,” “upper” and the like, may be used herein for ease of description to describe one element or feature’s relationship to another element(s) or feature(s) as illustrated in the drawings. The spatially relative terms are intended to encompass different orientations of the device in use or operation in addition to the orientation depicted in the drawings.

FIG. 1 illustrates a cross-sectional view of a semiconductor structure 100 according to an embodiment of the present disclosure. As shown in the figure, the semiconductor structure 100 includes a substrate 110, a gate structure 120, a first oxide layer 130, and a second oxide layer 140. The substrate 110 has a trench 111 that includes an inclined surface 112 and a bottom surface 113, and the inclined surface 112 and the bottom surface 113 have an obtuse angle A1 therebetween. The gate structure 120 is located in the trench 111 of the substrate 110. A width of a bottom surface 122 of the gate structure 120 is less than a width of a top surface 124 of the gate structure 120. A cross-sectional profile of the gate structure 120 is inverted trapezoid. The first oxide layer 130 is located between the gate structure 120 and the substrate 110. The second oxide layer 140 is located on the top surface 124 of the gate structure 120. In some embodiments, the substrate 110 may be used as a base of a metal-oxide-semiconductor field-effect transistor (MOSFET), the gate structure 120 may be used as a gate, and the first oxide layer 130 and the second oxide layer 140 may be used as gate oxide (gate oxide) layers, such that the semiconductor structure 100 may be applied to power MOSFETs as a trench MOS structure.

In addition, since the cross-sectional profile of the gate structure 120 is inverted trapezoid, and a width of the bottom surface 122 of the gate structure 120 is less than a width of the top surface 124 of the gate structure 120, the electric field concentrated at a base angle of the gate structure 120 when the gate voltage is applied to the semiconductor structure 100 can be reduced to protect the first oxide layer 130, avoiding gate oxide breakdown and the leakage current caused thereby.

In addition, the gate structure 120 may have a side wall 126 adjacent to the top surface 124 and the bottom surface 122, and the bottom surface 122 and the side wall 126 of the gate structure 120 have an obtuse angle A2 therebetween. In some embodiments, the obtuse angle A2 between the bottom surface 122 and the side wall 126 of the gate structure 120 may be in a range from 108 degrees to 118 degrees. An obtuse angle A1 between the inclined surface 112 and the bottom surface 113 of the substrate 110 may be the same as the obtuse angle A2 between the bottom surface 122 and the side wall 126 of the gate structure 120. That is, the obtuse angle A1 between the inclined surface 112 and the bottom surface 113 of the substrate 110 may be in a range from 108 degrees to 118 degrees. In such a configuration, the base angle of the gate structure 120 is the obtuse angle A2, rather than a right angle or an acute angle, such that the bottom of the gate structure 120 has a larger radius of curvature to reduce the intensity of the electric field adjacent to the base angle of the gate structure 120.

In some embodiments, the gate structure 120 is covered by the first oxide layer 130 and the second oxide layer 140, and a thickness of the first oxide layer 130 is the same as that of the second oxide layer 140. In this embodiment, the thickness of the first oxide layer 130 and the thickness of the second oxide layer 140 may be about 40 nm. In addition, the material of the first oxide layer 130 and the material of the second oxide layer 140 may be the same, and may include silicon dioxide or hafnium oxide ($HfO_x$).

In addition, the material of the gate structure 120 may include polysilicon, tantalum, tungsten, tantalum nitride or titanium nitride, and the material of the substrate 110 may include silicon or silicon carbide.

In some embodiments, the substrate 110 further has an epitaxial region 114, a well region 115 located on the epitaxial region 114, and a first doping region 116 and a second doping region 117 located in the well region 115. The well region 115 extends to the first oxide layer 130. The first doping region 116 is adjacent to the second doping region 117, and a cross-sectional profile of the first doping region 116 is L-shaped. In this way, the first doping region 116 and the second doping region 117 may be used as a source contact region, and the bottom of the substrate 110 may be used as a drain contact region, such that the semiconductor structure 100 be used may as a power metal-oxide-semiconductor field-effect transistor (power MOSFET). In some embodiments, the substrate 110 may be an N-type substrate, the well region 115 may be a P-type well, the first doping region 116 may include an N-type dopant (such as phosphorus or arsenic or nitrogen), and the second doping region 117 may include a P-type dopant (such as aluminum or boron), such that the semiconductor structure 100 may be used as an N-type power MOSFET. In addition, the semiconductor structure 100 may further have a first conducting layer 152 located on the first doping region 116 and the second doping region 117 of the substrate 110 and a second conducting layer 154 located below the substrate 110. The first conducting layer 152 may be used as a source of the power MOSFET, and the second conducting layer 154 may be used as a drain of the power MOSFET.

Figure 2:
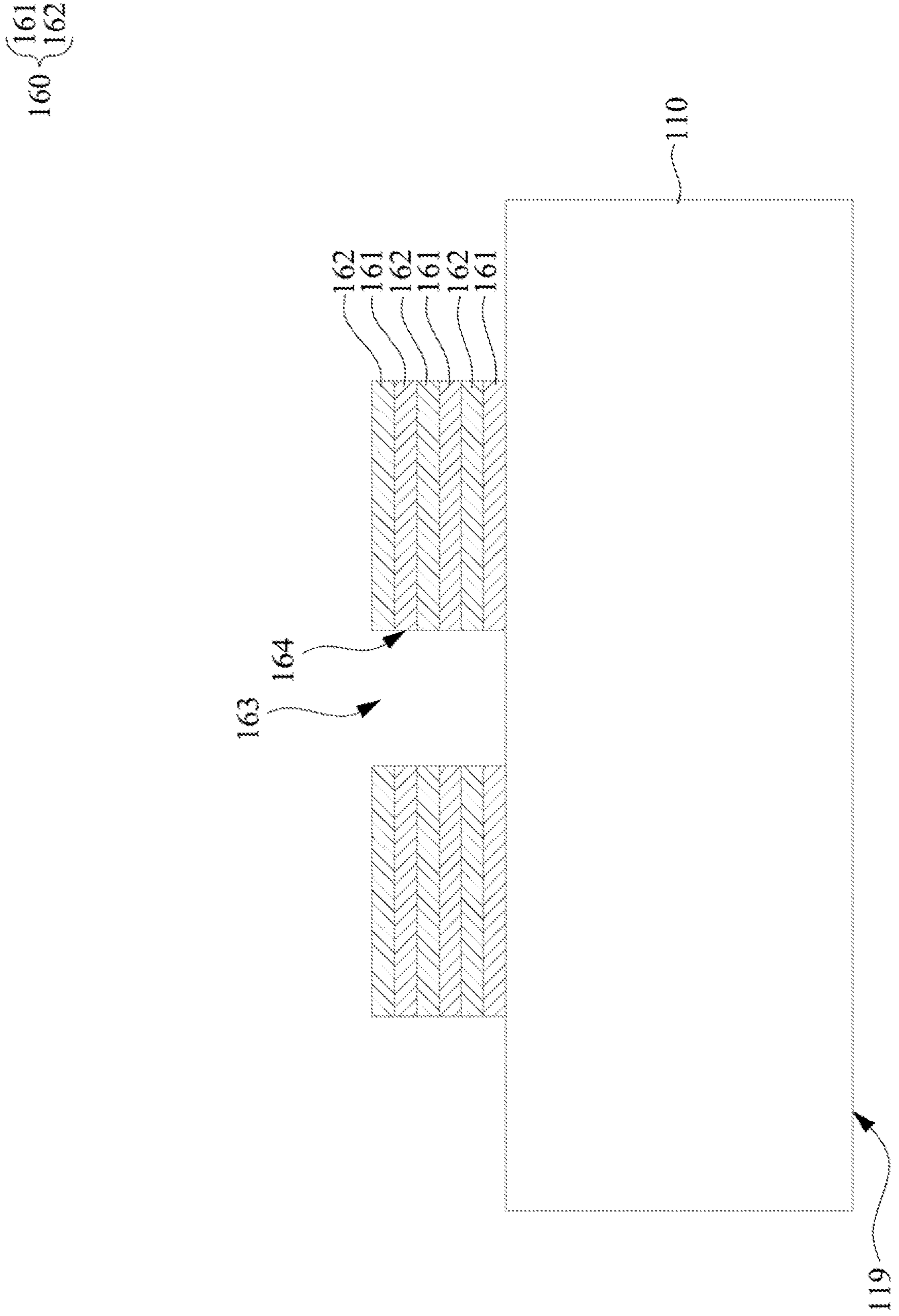
FIGS. 2-11 illustrates cross-sectional views of the intermediate phase of a manufacturing method of a semiconductor structure of FIG. 1.

Referring to FIG. 2, the manufacturing method of the semiconductor structure 100 includes: forming a patterned film stack structure 160 on the substrate 110, in which the film stack structure 160 has a plurality of first hard mask layers 161 and a plurality of second hard mask layers 162 sequentially stacked in a staggered manner, and a quantity of the plurality of first hard mask layers 161 is the same as a quantity of the plurality of second hard mask layers 162 and is a positive integer N less than or equal to 5. In this embodiment, the positive integer N is 3. In addition, a material of the plurality of first hard mask layers 161 may be different from a material of the plurality of second hard mask layers 162, such that the plurality of first hard mask layers 161 and the plurality of second hard mask layers 162 may be used as etch stop layers to each other. In some embodiments, the materials of the plurality of first hard mask layers 161 and the plurality of second hard mask layers 162 include silicon dioxide, silicon nitride or polysilicon, for example, the material of the plurality of first hard mask layers 161 is silicon dioxide, and the material of the plurality of second hard mask layers 162 is silicon nitride. In addition, a thickness of any of the plurality of first hard mask layers 161 and a thickness of any of the plurality of second hard mask layers 162 may be the same, and the sum thereof is in a range from 0.05 μm to 5.05 μm.

Then, a photoresist layer may be formed on the film stack structure 160, and a thickness of the photoresist layer is greater than a thickness of the film stack structure 160 plus 1 μm. Then, exposure and development are performed by using a photomask 180 to remove part of the photoresist layer, to expose part of the film stack structure 160. In some embodiments, a width of the photomask 180 may be 5 μm.

Then the film stack structure 160 exposed from the photoresist layer is removed using reactive-ion etching, such that the film stack structure 160 has a recess 163 and a side wall 164 facing the recess 163. In some embodiments, a width of the recess 163 of the film stack structure 160 may be 1 μm. Then the photoresist layer may be removed.

Figure 3:
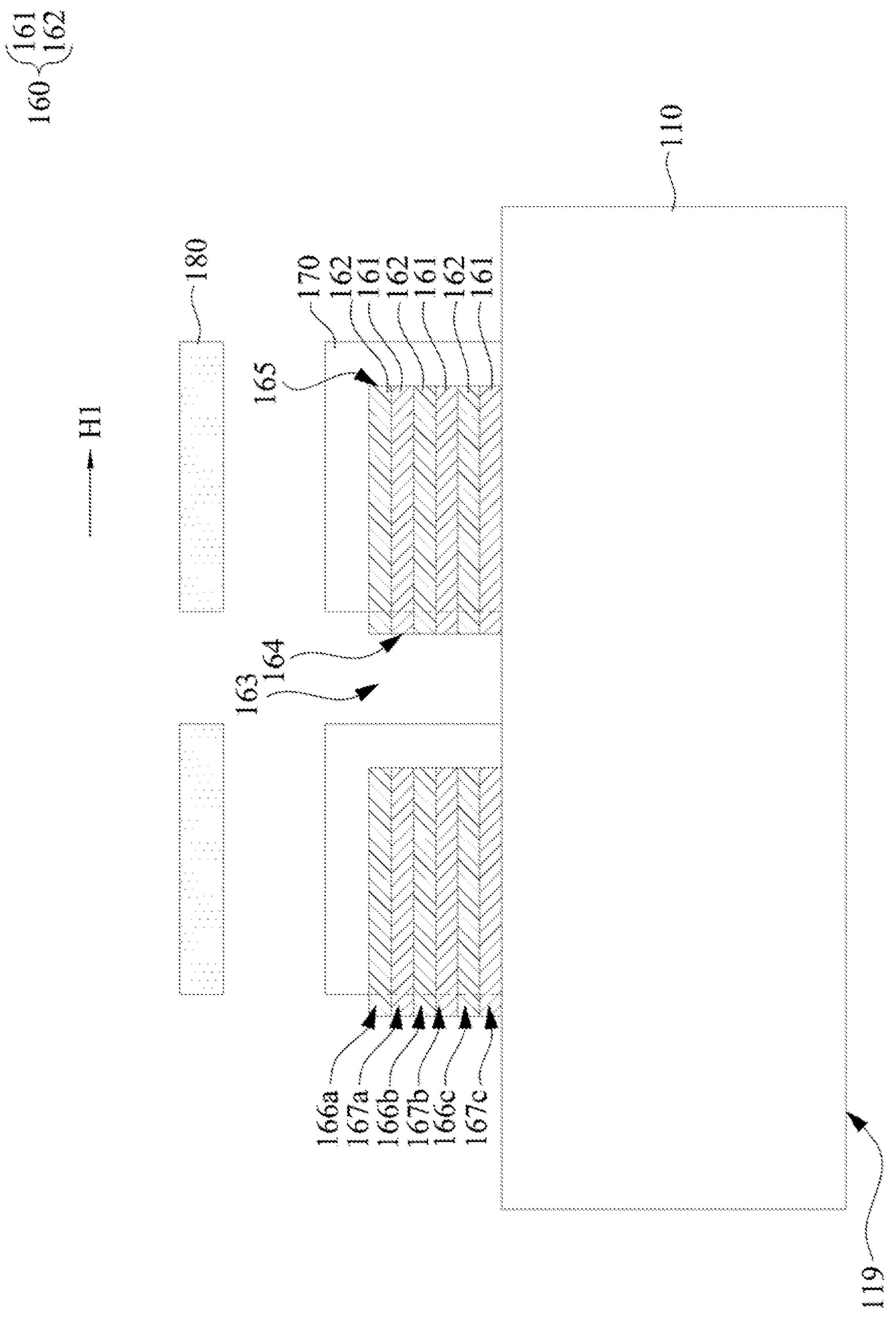

Referring to FIG. 3, a photoresist layer 170 is formed on the film stack structure 160 again, such that a first part 166*a* of the topmost one of the plurality of second hard mask layers 162 of the film stack structure 160 is exposed from the photoresist layer 170. In addition, the photoresist layer 170 extends to and covers a side wall 165 of the film stack structure 160 back to the recess 163 and opposite to the side wall 164. In some embodiments, a width of the first part 166*a* of the topmost one of the plurality of second hard mask layers 162 is in a range from 0.2 μm to 0.63 μm.

Figure 4:
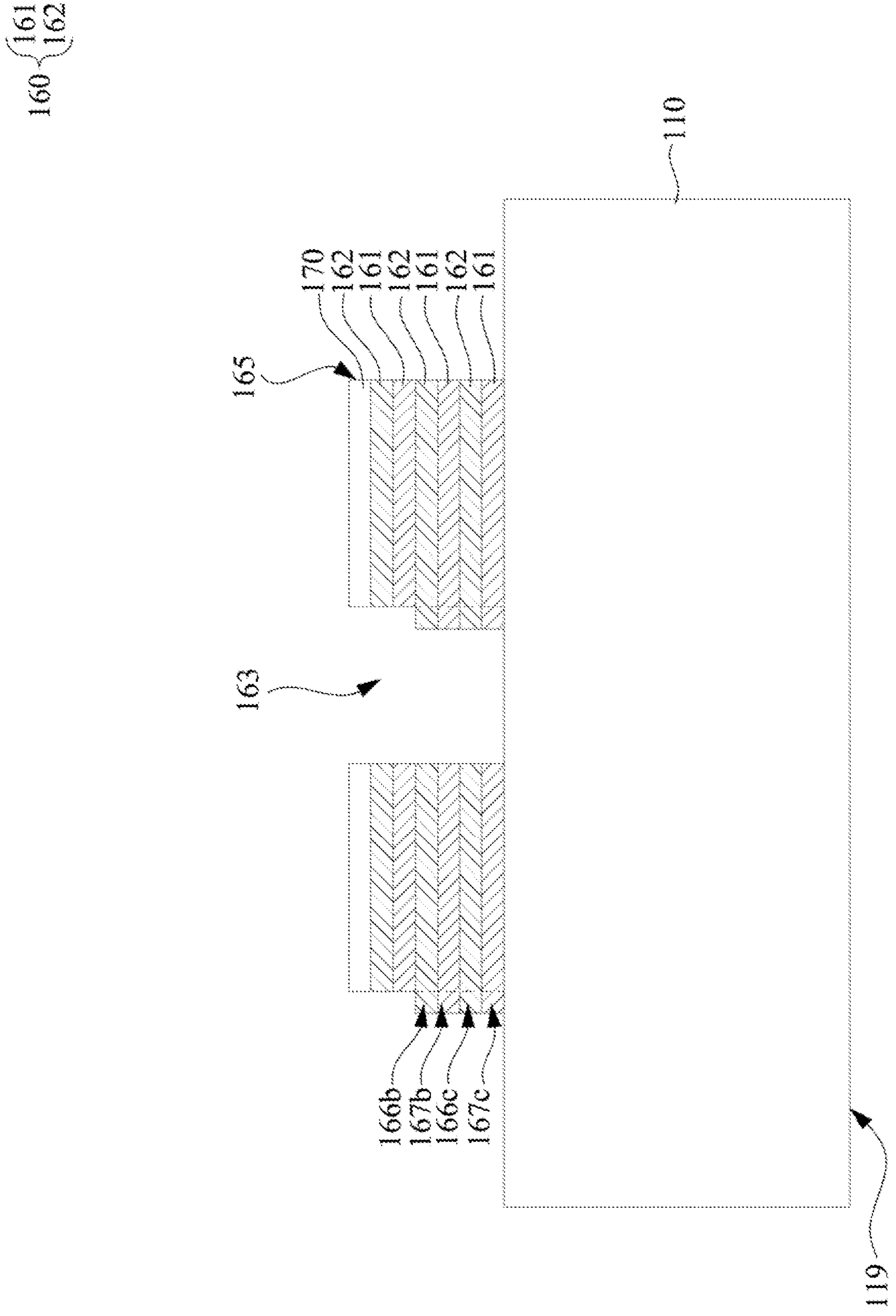

Then, referring to FIGS. 3 and 4, the first part 166*a* of the topmost one of the plurality of second hard mask layers 162 that is not covered by the photoresist layer 170 may be removed, to expose a first part 167*a* of the first hard mask layer 161 thereunder. In this step, the second hard mask layer 162 may be removed using reactive-ion etching having a selective ratio between the first hard mask layer 161 and the second hard mask layer 162, such that the first hard mask layer 161 may be used as an etch stop layer in this step. Then, the exposed first part 167*a* of the first hard mask layer 161 may be removed, to expose a first part 166*b* of another second hard mask layer 162. In this step, the second hard mask layer 162 may be removed using reactive-ion etching having a selective ratio between the first hard mask layer 161 and the second hard mask layer 162, such that the first hard mask layer 161 may be used as an etch stop layer in this step. Then, the photoresist layer 170 of FIG. 4 may be removed.

Figure 5:
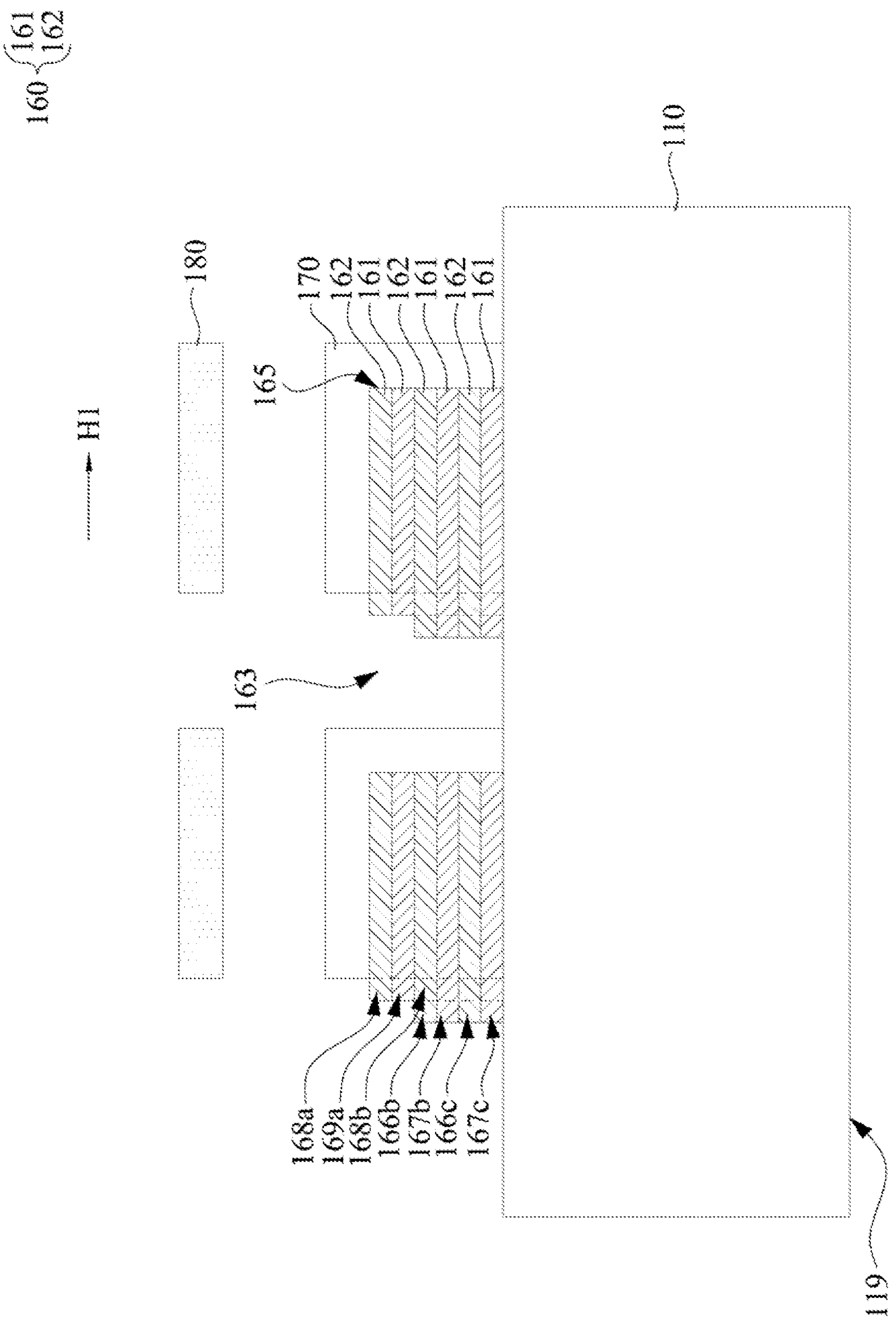

Referring to FIG. 5, the photoresist layer 170 is formed on the film stack structure 160 again, such that a second part 168*a* of the topmost one of the plurality of second hard mask layers 162 and the first part 166*b* of another second hard mask layer 162 are exposed. In addition, the photoresist layer 170 extends to and covers the side wall 165 of the film stack structure 160 back to the recess 163.

Figure 6:
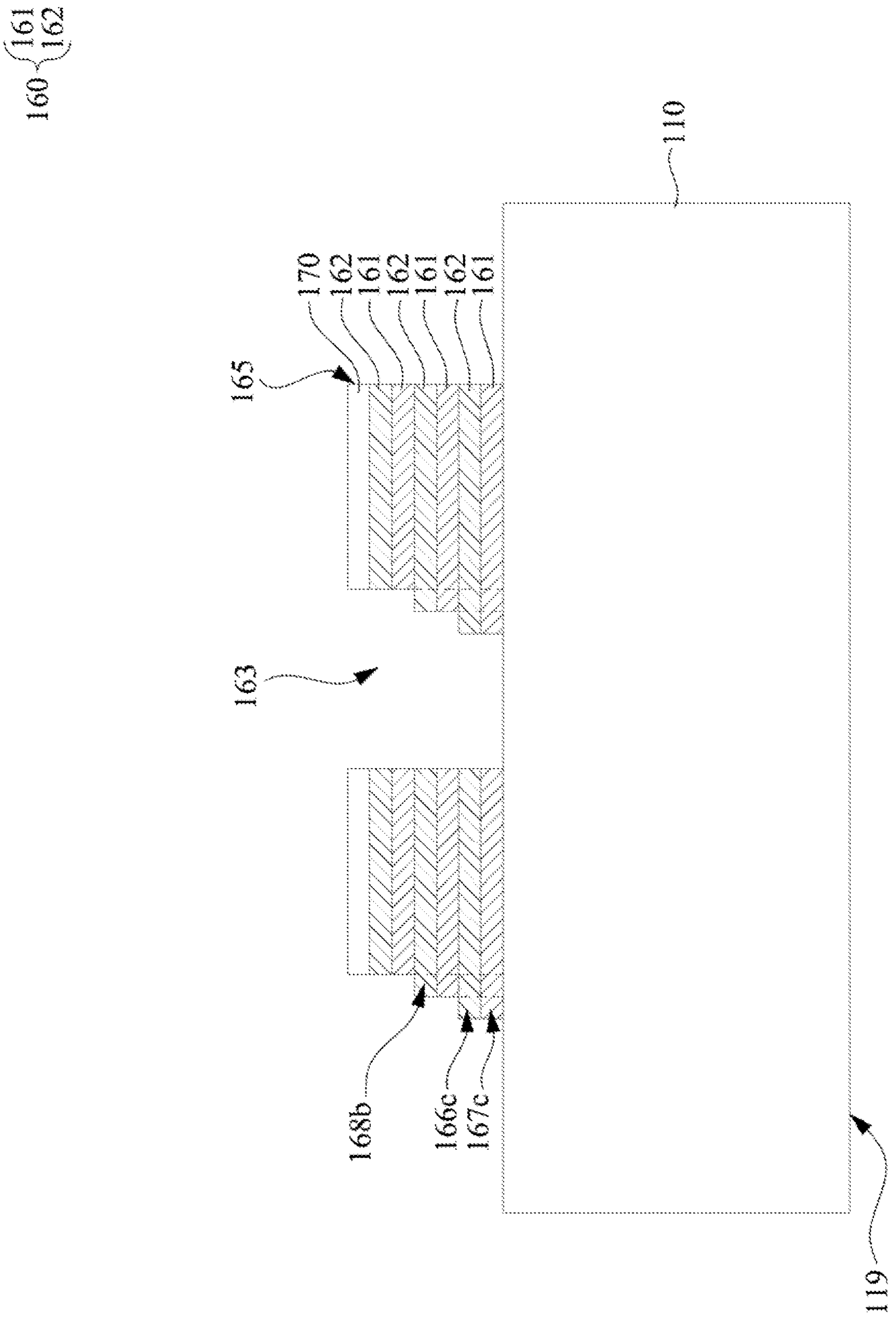

Referring to FIGS. 5 and 6, the first hard mask layer 161 may be then used as the etch stop layer again, the second part 168*a* of the topmost one of the plurality of second hard mask layers 162 is removed, and the first part 166*b* of another second hard mask layer 162 is removed, such that a second part 169*a* of the topmost one of the plurality of first hard mask layers 161 and a first part 167*b* of another first hard mask layer 161 are exposed. Then the second hard mask layer 162 may be used as the etch stop layer again, the exposed second part 169*a* of the topmost one of the plurality of first hard mask layers 161 and the first part 167*b* of another first hard mask layer 161 are removed, such as a first part 166*c* of the lowest one of the plurality of second hard mask layers 162 and a second part 168*b* of another second hard mask layer 162 are exposed from the photoresist layer 170. Then, the photoresist layer 170 of FIG. 6 may be removed.

Figure 7:
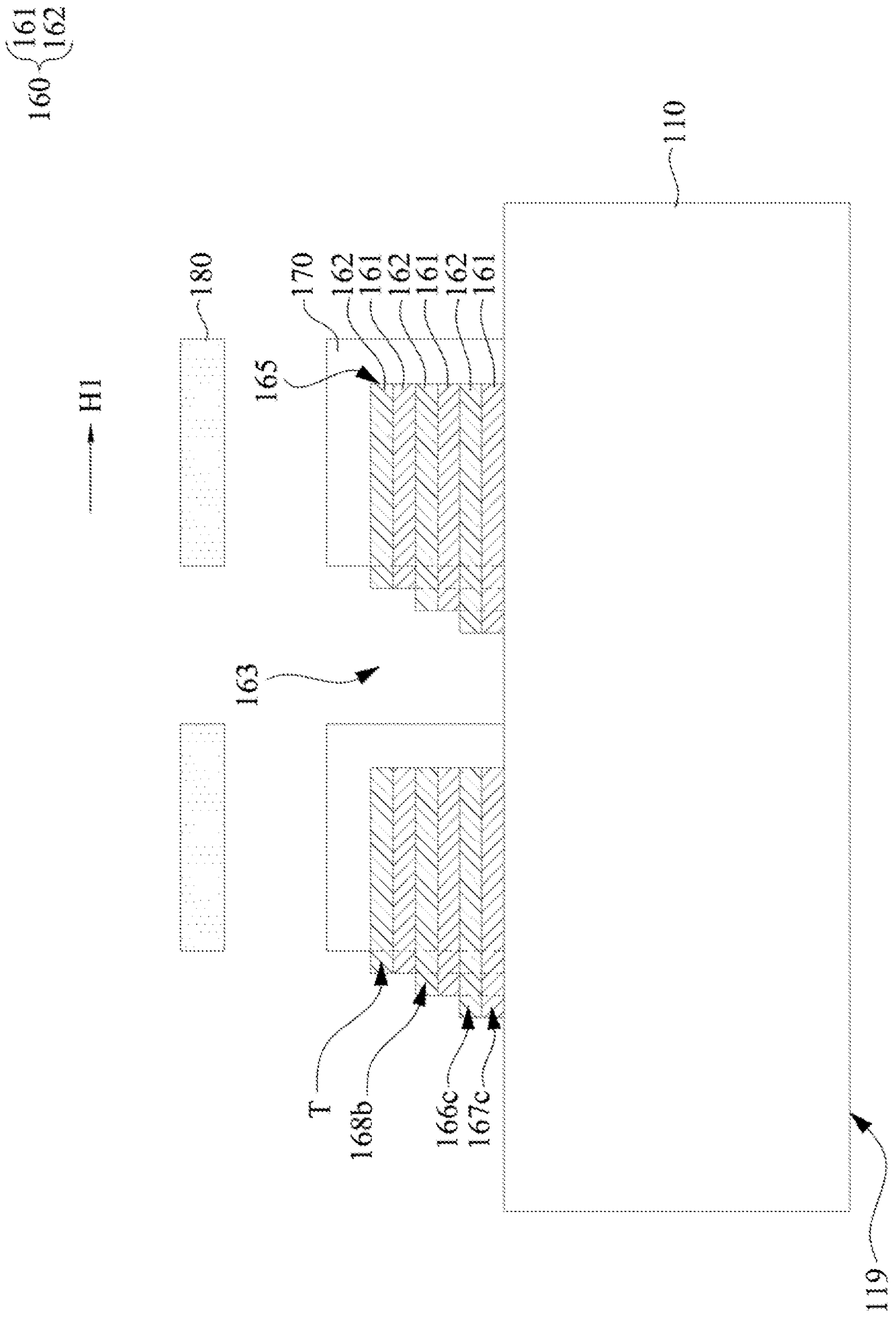

Referring to FIG. 7, the photoresist layer 170 is formed on the film stack structure 160 again, such that a third part T of the topmost one of the plurality of second hard mask layers 162, the second part 168*b* of another second hard mask layer 162, and the first part 166*c* of the lowest one of the plurality of second hard mask layers 162 are exposed.

In some embodiments, the quantity of the plurality of first hard mask layers 161 and the quantity of the plurality of second hard mask layers 162 may be a positive integer N less than and equal to 5 and not equal to 3 (in this embodiment, the positive integer N is 3), and thus this step may be deleted or repeated until the first part 166*c* of the lowest one of the plurality of second hard mask layers 162 and a part of the topmost one of the plurality of second hard mask layers 162 are exposed from the photoresist layer 170.

Figure 8:
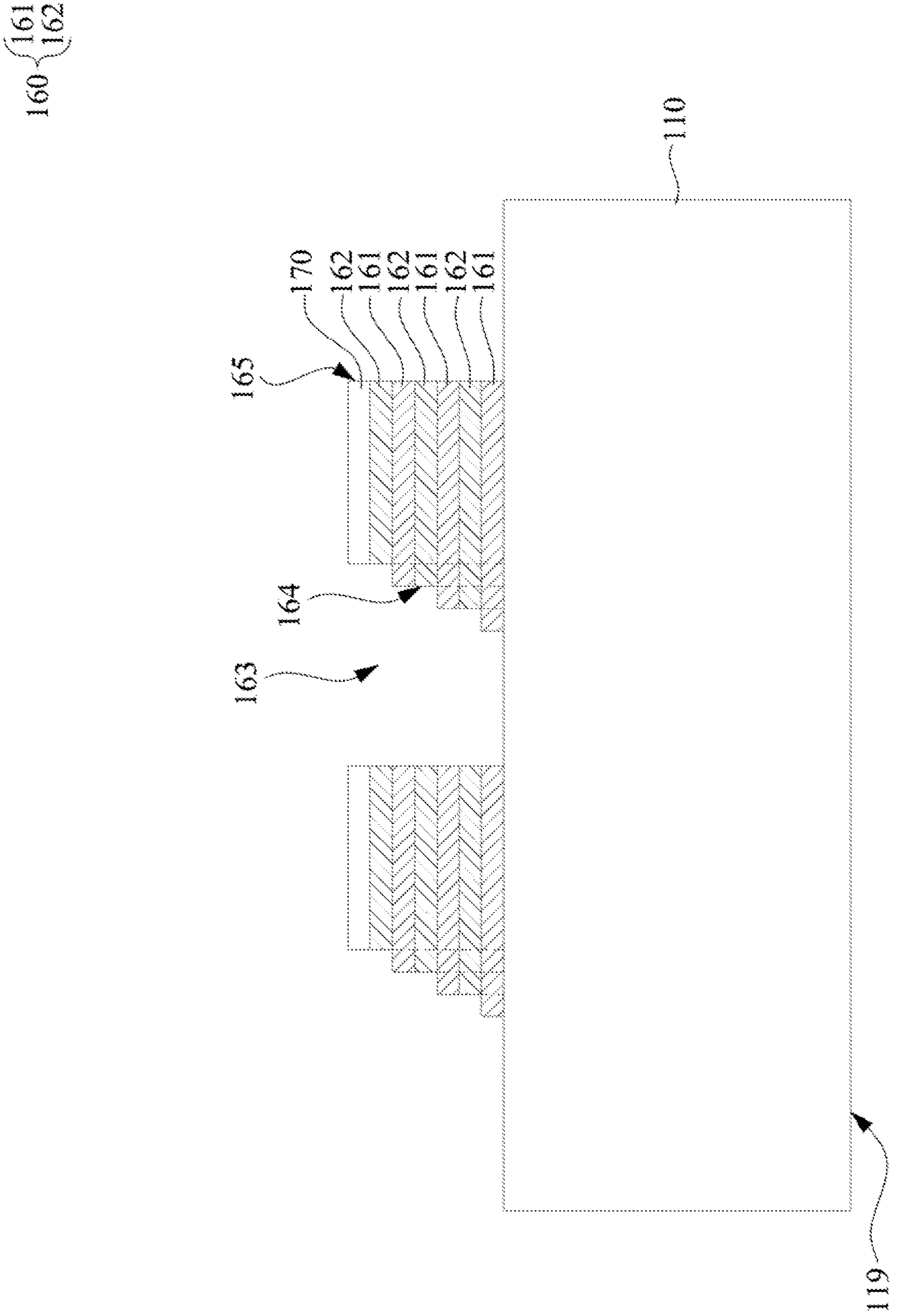

Referring to FIGS. 7 and 8, then the first hard mask layer 161 may be used as the etch stop layer again, the exposed third part T of the topmost one of the plurality of second hard mask layers 162, the second part 168*b* of another second hard mask layer 162, and the first part 166*c* of the lowest one of the plurality of second hard mask layers 162 are removed, such that a first part 167*c* of the lowest one of the plurality of first hard mask layers 161 is removed, and the side wall 164 of the film stack structure 160 may be stepped. Then the photoresist layer 170 of FIG. 8 may be removed, to expose the topmost one of the plurality of second hard mask layers 162.

Figure 9:
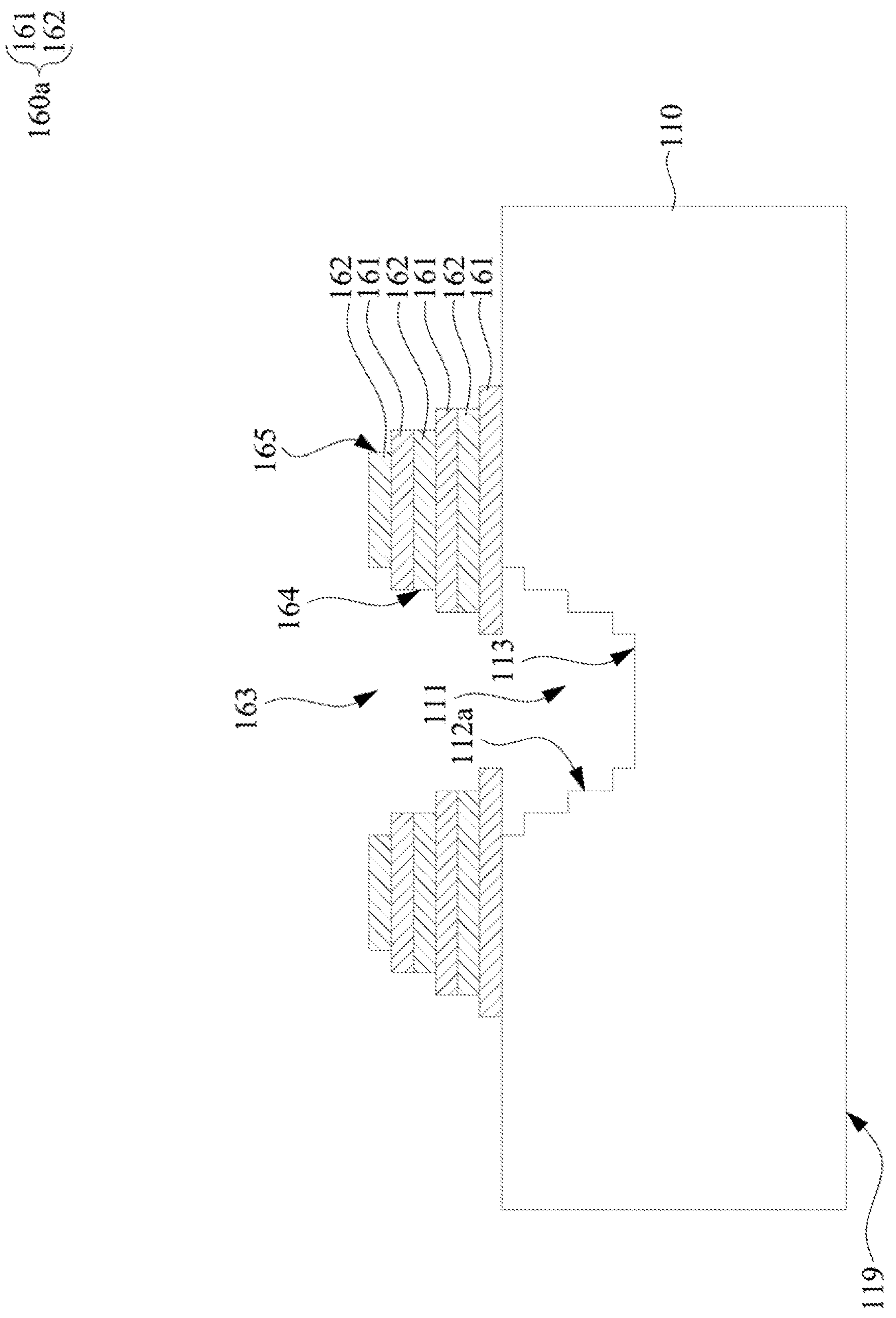

Referring to FIG. 9, after the photoresist layer 170 of FIG. 8 is removed, a side wall 165 of the film stack structure 160 back to the recess 163 and opposite to the side wall 164 may be stepped according to the method above, and the film stack structure 160 may define a hard mask structure 160*a*. In some embodiments, a distance between the side wall 164 and the side wall 165 of the film stack structure 160 in a horizontal direction H1 is in a range from 0.5 μm to 5.5 μm.

Then the substrate 110 located below the hard mask structure 160*a* and exposed from the recess 163 may be etched to form a trench 111 that includes a side wall 112*a* and a bottom surface 113. Since the hard mask structure 160*a* is stepped, the side wall 112*a* of the trench 111 is stepped after the substrate 110 in the recess 163 is subjected to the etching step. In addition, a width of the bottom surface 113 of the substrate 110 is approximately the same as a width of the bottom of the recess 163 of the hard mask structure 160*a*. Then the hard mask structure 160*a* may be removed.

Figure 10:
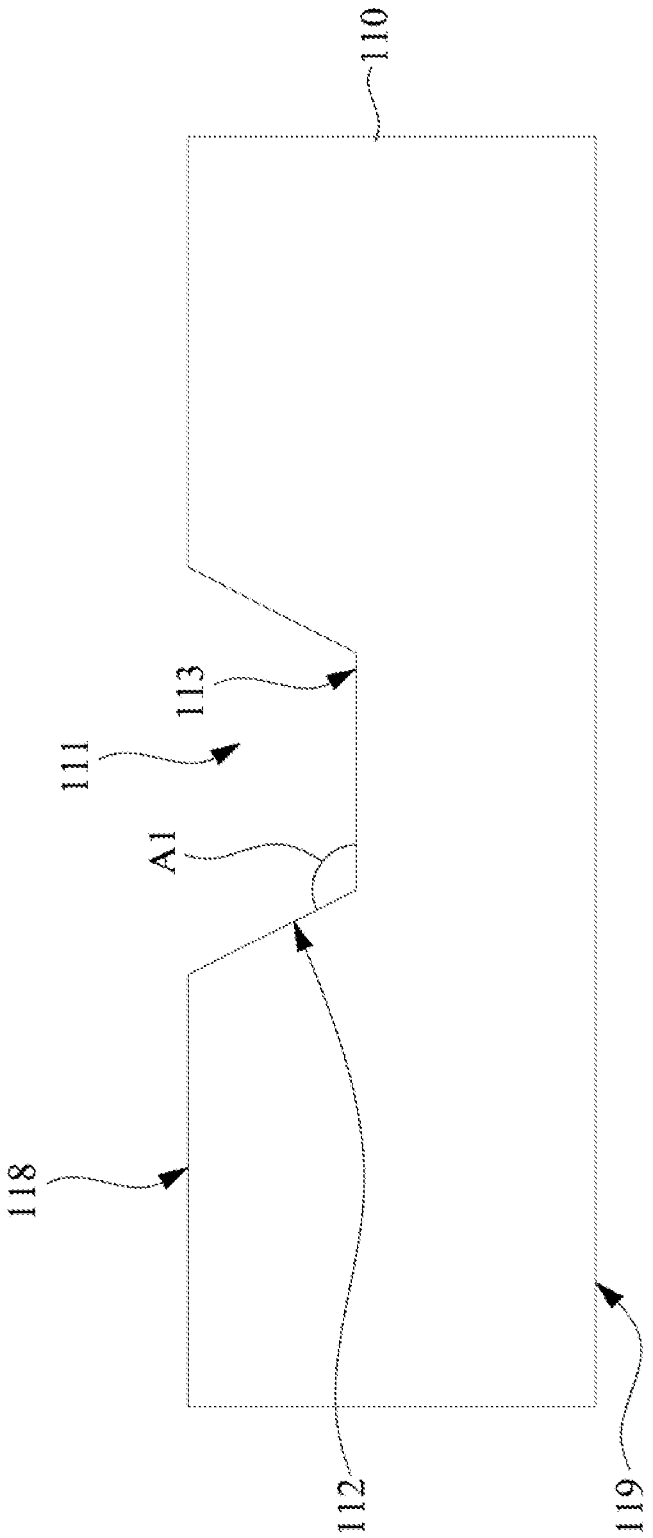

Referring to FIG. 10, the side wall 112*a* and the bottom surface 113 of the substrate 110 may be planarized. In some embodiments, the side wall 112*a* and the bottom surface 113 are oxidized to form a surface oxide layer, and a thickness of the surface oxide layer is in a range from 10 nm to 50 nm.

Then the surface oxide layer may be removed, such that the side wall 112*a* of the substrate 110 forms an inclined surface 112, and the inclined surface 112 and the bottom surface 113 have an obtuse angle A1 therebetween, and the obtuse angle A1 is in a range from 108 degrees to 118 degrees.

Figure 11:
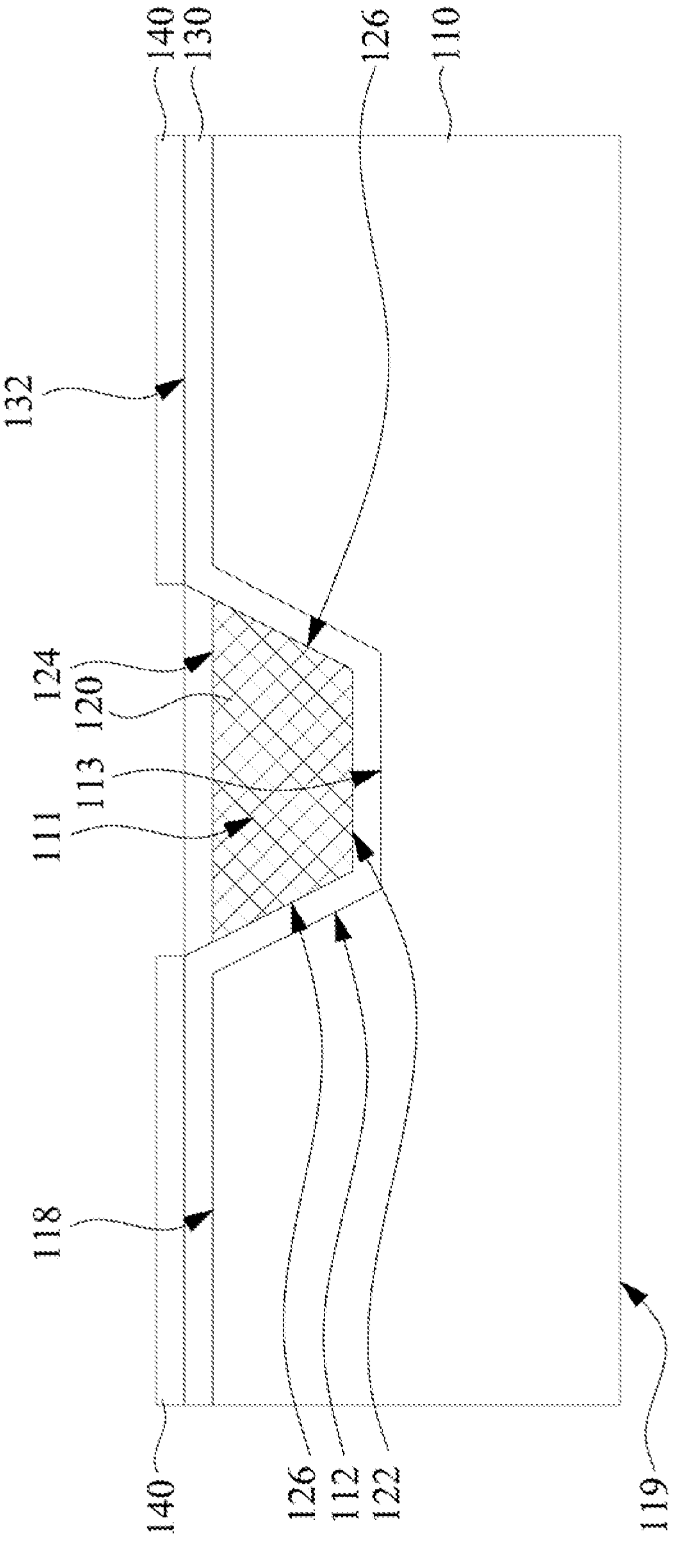

Referring to FIG. 11, the first oxide layer 130, the gate structure 120 and the second oxide layer 140 may be sequentially formed on the substrate 110, such that the first oxide layer 130 covers the substrate 110 and is located between the substrate 110 and the gate structure 120. In addition, the trench 111 of the substrate 110 may be filled with the first oxide layer 130 and the gate structure 120. In some embodiments, a thickness of the first oxide layer 130 is about 40 nm.

After the first oxide layer 130 and the gate structure 120 are sequentially formed on the substrate 110, part of the gate structure 120 may be removed using an etchant having a selective ratio between the gate structure 120 and the first oxide layer 130, such that a cross-sectional profile of the remaining gate structure 120 is inverted trapezoid, and a top surface 132 of the first oxide layer 130 is exposed. In addition, a top surface 124 of the gate structure 120 may be lower than the top surface 132 of the first oxide layer 130, such that the top surface 124 of the gate structure 120 and the top surface 118 of the substrate 110 are approximately coplanar. In some embodiments, the top surface 124 of the gate structure 120 may be about 40 nm lower than the top surface 132 of first oxide layer 130, a width of the bottom surface 122 of the gate structure 120 may be 1 μm, a width of the top surface 124 of the gate structure 120 may be 3 μm, and a thickness of the gate structure 120 may be in a range from 2 μm to 3 μm. Then the second oxide layer 140 may be formed on the top surface 124 of the gate structure 120 and the top surface 132 of the first oxide layer 130, such that the gate structure 120 is covered by the first oxide layer 130 and the second oxide layer 140. In addition, the material and thickness of the second oxide layer 140 may be the same as the material and thickness of the first oxide layer 130, respectively. For example, the thickness of the first oxide layer 130 and the thickness of the second oxide layer 140 may be about 40 nm.

Referring to FIG. 1, then the well region 115, the first doping region 116 and the second doping region 117 are formed in the substrate 110 using ion implantation, in which the first doping region 116 and the second doping region 117 may include different dopants. In some embodiments, the first oxide layer 130 and the second oxide layer 140 located on the top surface 118 of the substrate 110 may be removed, and the first conducting layer 152 and the second conducting layer 154 are respectively formed on the top surface 118 and the bottom surface 119 of the substrate 110, to obtain the semiconductor structure 100. The first conducting layer 152 is located on the first doping region 116 and the second doping region 117. In such a configuration, the first doping region 116 and the second doping region 117 may be used as a source contact region, the bottom of the substrate 110 may be used as a drain contact region, the first conducting layer 152 may be used as a source, and the second conducting layer 154 may be used as a drain, such that the semiconductor structure 100 may be applied to the power MOSFET.

What is claimed is:

1. A manufacturing method of a semiconductor structure, comprising:

forming a hard mask structure on a substrate, wherein the hard mask structure has a recess, and a side wall of the hard mask structure facing the recess is stepped;

etching the substrate from the recess through the hard mask structure to form a trench, wherein the trench has a side wall and a bottom surface, and the side wall is stepped;

planarizing the side wall of the trench, such that the side wall and the bottom surface have an obtuse angle therebetween;

forming a first oxide layer on the side wall and the bottom surface of the trench;

forming a gate structure on the first oxide layer in the trench, wherein a width of a bottom surface of the gate structure is less than a width of a top surface of the gate structure, and a cross-sectional profile of the gate structure is inverted trapezoid; and forming a second oxide layer on the gate structure.

2. The manufacturing method of a semiconductor structure according to claim 1, wherein the forming a hard mask structure on a substrate comprises the following steps:

(a) forming a photoresist layer on a film stack structure by using a photomask, wherein the film stack structure has a plurality of first hard mask layers and a plurality of second hard mask layers sequentially stacked in a staggered manner, and a first part of the topmost one of the plurality of second hard mask layers is exposed from the photoresist layer;

(b) removing the first part of the topmost one of the plurality of second hard mask layers and a first part of one of the plurality of first hard mask layers thereunder;

(c) removing the photoresist layer;

(d) moving the photomask in a horizontal direction by a displacement, and forming the photoresist layer again on the film stack structure, such that a second part of the topmost one of the plurality of second hard mask layers and a first part of the other one of the plurality of second hard mask layers are exposed;

(e) removing the second part of the topmost one of the plurality of second hard mask layers and a second part of one of the plurality of first hard mask layers thereunder, and synchronously removing the first part of the other one of the plurality of second hard mask layers and a first part of one of the plurality of first hard mask layers thereunder;

(f) removing the photoresist layer again;

(g) repeating steps (d) to (f) until a first part of the lowest one of the plurality of second hard mask layers is exposed from the photoresist layer; and (h) removing the first part of the lowest one of the plurality of second hard mask layers, such that the film stack structure defines the hard mask structure.

3. The manufacturing method of a semiconductor structure according to claim 2, wherein the displacement is in a range from 0.2 μm to 0.63 μm.

4. The manufacturing method of a semiconductor structure according to claim 3, wherein a thickness of the photoresist layer is greater than a thickness of the film stack structure plus 1 μm.

5. The manufacturing method of a semiconductor structure according to claim 3, wherein the hard mask structure further has another side wall opposite to the side wall and back to the recess, and a distance between the side wall and the another side wall is in a range from 0.5 μm to 5.5 μm.

6. The manufacturing method of a semiconductor structure according to claim 1, wherein the forming a hard mask structure on a substrate comprises: forming a plurality of first hard mask layers and a plurality of second hard mask layers sequentially stacked in a staggered manner, and a quantity of the plurality of first hard mask layers is the same as a quantity of the plurality of second hard mask layers and is a positive integer less than or equal to 5.

7. The manufacturing method of a semiconductor structure according to claim 6, wherein a sum of a thickness of any of the plurality of first hard mask layers and a thickness of any of the plurality of second hard mask layers is in a range from 0.05 μm to 5.05 μm.

8. The manufacturing method of a semiconductor structure according to claim 7, wherein a material of the plurality of first hard mask layers is different from a material of the plurality of second hard mask layers, and the materials of the plurality of first hard mask layers and the plurality of second hard mask layers comprise silicon dioxide, silicon nitride or polysilicon.

9. A manufacturing method of a semiconductor structure, comprising:

forming a photoresist layer on a film stack structure by using a photomask, wherein the film stack structure has a plurality of first hard mask layers and a plurality of second hard mask layers sequentially stacked in a staggered manner;

removing a first part of the topmost one of the plurality of second hard mask layers and a first part of one of the plurality of first hard mask layers thereunder;

removing the photoresist layer;

moving the photomask in a horizontal direction, and forming the photoresist layer again on the film stack structure;

removing a second part of the topmost one of the plurality of second hard mask layers and a first part of the other one of the plurality of second hard mask layers;

removing the photoresist layer again, such that the film stack structure defines a stepped hard mask structure;

etching a substrate located below the hard mask structure, such that the substrate has a trench and a stepped side wall facing the trench;

oxidizing the stepped side wall to form a surface oxide layer;

removing the surface oxide layer, such that the stepped side wall forms an inclined surface; and forming a gate structure in the trench of the substrate, such that a side wall and a bottom surface of the gate structure have an obtuse angle therebetween.

10. The manufacturing method of a semiconductor structure according to claim 9, wherein the stepped side wall is oxidized, such that a thickness of the surface oxide layer is in a range from 10 nm to 50 nm.

* * * * *